US012669522B2

(12) United States Patent (10) Patent No.: US 12,669,522 B2
Yang et al. (45) Date of Patent: Jun. 30, 2026

(54) TEST APPARATUS AND BATTERY PRODUCTION LINE

(71) Applicant: CONTEMPORARY AMPEREX TECHNOLOGY CO., LIMITED, Ningde (CN)

(72) Inventors: Jun Yang, Ningde (CN); Shunlin Liao, Ningde (CN); Wei Cao, Ningde (CN)

(73) Assignee: CONTEMPORARY AMPEREX TECHNOLOGY (HONG KONG) LIMITED, Hong Kong (CN)

( * ) Notice: Subject to any disclaimer, the term of this patent is extended or adjusted under 35 U.S.C. 154(b) by 161 days.

(21) Appl. No.: 18/516,990

(22) Filed: Nov. 22, 2023

(65) Prior Publication Data

US 2024/0426873 A1 Dec. 26, 2024

Related U.S. Application Data

(63) Continuation of application No. PCT/CN2023/101909, filed on Jun. 21, 2023.

(51) Int. Cl.
*G01R 1/073* (2006.01)
*G01R 1/26* (2006.01)
(52) U.S. Cl.
CPC ..... *G01R 1/07314* (2013.01); *G01R 1/07364* (2013.01); *G01R 1/26* (2013.01)
(58) Field of Classification Search
None
See application file for complete search history.

(56) References Cited

U.S. PATENT DOCUMENTS 5,290,134 A * 3/1994 Baba ................. G01R 31/2851
414/754
5,900,691 A * 5/1999 Reuter ................. H02N 2/0025
310/323.16
(Continued)

FOREIGN PATENT DOCUMENTS

CN 107422217 A 12/2017
CN 210894412 U 6/2020
(Continued)

OTHER PUBLICATIONS

English translation—CN 217787314U (Year: 2022).*
(Continued)

*Primary Examiner* — Richard Isla
(74) *Attorney, Agent, or Firm* — XSENSUS LLP

(57) ABSTRACT

This application provides a test apparatus and a battery production line. The test apparatus includes a fixing mechanism and a plurality of test probe mechanisms. The test probe mechanisms are slidably connected to the fixing mechanism side by side along a first direction. In the test apparatus provided in embodiments of this application, the fixing mechanism is provided with a plurality of test probe mechanisms, and the test probe mechanisms can slide along the first direction relative to the fixing mechanism. In this way, distances between the test probe mechanisms can be adaptively adjusted according to the dimensions of to-be-tested battery cells, that is, the distances can quickly respond and adapt to changes in dimensions of incoming battery cells, so that the test efficiency can be significantly improved.

17 Claims, 5 Drawing Sheets

(56) References Cited

U.S. PATENT DOCUMENTS

| | | | | |
|---|---|---|---|---|
| 6,450,469 B1 * | 9/2002 | Okuno | ................... | G09G 3/006 |
| | | | | 248/287.1 |
| 9,007,086 B2 * | 4/2015 | Mo | ....................... | G02F 1/1303 |
| | | | | 324/756.01 |
| 9,411,012 B2 * | 8/2016 | Hasegawa | ............... | H01L 24/75 |
| 2022/0365038 A1 * | 11/2022 | Ma | ....................... | G01N 29/265 |

FOREIGN PATENT DOCUMENTS

| | | | | | |
|---|---|---|---|---|---|
| CN | 212459975 U | | 2/2021 | | |
| CN | 114062738 A | * | 2/2022 | ......... | G01R 1/07307 |
| CN | 115032539 A | | 9/2022 | | |
| CN | 217787314 U | * | 11/2022 | | |
| CN | 217820758 U | | 11/2022 | | |
| CN | 116231035 A | | 6/2023 | | |
| WO | 2021/109126 A1 | | 6/2021 | | |

OTHER PUBLICATIONS

Extended European Search Report issued Aug. 26, 2024 in European Patent Application No. 23806150.1.
International Search Report issued Dec. 11, 2023 in International Patent Application No. PCT/CN2023/101909 with English translation thereof.

* cited by examiner

TEST APPARATUS AND BATTERY PRODUCTION LINE

CROSS-REFERENCE TO RELATED APPLICATION

This application is a Continuation of International Application No. PCT/CN2023/101909, filed on Jun. 21, 2023, which is incorporated herein by reference in its entirety.

TECHNICAL FIELD

This application relates to the field of OCV test technologies, and in particular, to a test apparatus and a battery production line containing such test apparatus.

BACKGROUND

After going through processes such as formation, grading, and labeling, battery cells further need to undergo an OCV (open circuit voltage) test, through which parameters of the battery cells such as K value (K value is the voltage drop of the battery cell per unit time, reflecting the self-discharge rate of the battery cell), current, voltage, and capacity can be obtained, so as to screen out a battery cell with unqualified electrochemical parameters, ensuring the quality of each batch of battery cells.

Generally, the OCV test for battery cell is performed on a batch basis. To be specific, battery cells are arranged and the OCV test is performed on battery cells in the same batch at one time. However, when battery cells of different dimensions are tested, how corresponding test conditions are quickly responded and adapted to has become an urgent problem to be solved.

SUMMARY

Embodiments of this application are intended to provide a test apparatus and a battery production line, so as to alleviate the technical problem of low test efficiency of the test apparatus when testing battery cells of different dimensions.

The technical solutions adopted in the embodiments of this application are as follows.

According to a first aspect, an embodiment of this application provides a test apparatus for testing incoming battery cells, where the test apparatus includes:

a fixing mechanism; and a plurality of test probe mechanisms, where the test probe mechanisms are slidably connected to the fixing mechanism side by side along a first direction.

The above technical solution in this embodiment of this application has at least the following technical effects or advantages.

In the test apparatus provided in this embodiment of this application, the fixing mechanism is provided with a plurality of test probe mechanisms, and the test probe mechanisms can slide along the first direction relative to the fixing mechanism. In this way, distances between the test probe mechanisms can be adaptively adjusted according to the dimensions of to-be-tested battery cells, that is, the distances can quickly respond and adapt to changes in dimensions of incoming battery cells, so that the test efficiency can be significantly improved.

In some embodiments, each of the test probe mechanisms is capable of independently sliding along the first direction relative to the fixing mechanism.

With the above technical solution adopted, the distances between the test probe mechanisms can be arbitrarily adjusted to adapt to test requirements of battery cells of different dimensions in the same batch.

In some embodiments, at least some of the test probe mechanisms slide synchronously along the first direction relative to the fixing mechanism.

With the above technical solution adopted, the test probe mechanisms can slide to corresponding preset positions at the same time, so that the battery cells can be quickly tested.

In some embodiments, the test probe mechanisms slide synchronously along the first direction relative to the fixing mechanism and are arranged equidistantly.

With the above technical solution adopted, the test probe mechanisms can slide to corresponding preset positions at the same time, and the preset positions satisfy that distances between the test probe mechanisms are equal, so that battery cells of the same dimensions in the same batch can be quickly tested.

In some embodiments, the test apparatus includes a sliding mechanism, where the sliding mechanism includes a guide rail provided on the fixing mechanism and sliders provided on corresponding test probe mechanisms, the sliders being slidably connected to the guide rail.

With the above technical solution adopted, the sliders in the sliding mechanism are used to slide adaptively on the guide rail to satisfy that the test probe mechanisms slide along the first direction relative to the fixing mechanism.

In some embodiments, the test apparatus further includes a synchronization mechanism, where the synchronization mechanism includes a synchronization member that is connected to the test probe mechanisms and a driving member that drives the synchronization member to move relative to the fixing mechanism, and the synchronization member drives, during movement relative to the fixing mechanism, the test probe mechanisms to slide synchronously.

With the above technical solution adopted, the driving member is used to drive the synchronization member to move relative to the fixing mechanism, so that the test probe mechanisms slide synchronously, thereby improving the test efficiency.

In some embodiments, the synchronization member is slidably connected to the fixing mechanism in a second direction, the synchronization member is provided with a plurality of guide slots corresponding to the test probe mechanisms, and the test probe mechanism is provided with a limiting member slidably connected to the guide slot, the second direction being perpendicular to the first direction.

With the above technical solution adopted, the limiting members are used to slide in the guide slots to limit sliding trajectories of the test probe mechanisms, that is, the test probe mechanisms slide synchronously along the first direction relative to the fixing mechanism.

In some embodiments, the guide slot is provided with a first slot end and a second slot end, and the limiting member slides reciprocally between the first slot end and the second slot end.

With the above technical solution adopted, a start position and an end position of a corresponding test probe mechanism relative to the fixing mechanism are defined by the first slot end and the second slot end respectively.

In some embodiments, distances between first slot ends of any adjacent two of the guide slots are equal; and/or distances between second slot ends of any adjacent two of the guide slots are equal.

With the above technical solution adopted, the distances between the start positions of the test probe mechanisms are the same, and the distances between the end positions of the test probe mechanisms are also the same.

In some embodiments, the driving member includes a first fixed portion, a second fixed portion, a screw rod portion with two ends connected to the first fixed portion and the second fixed portion respectively, and a nut portion threadedly connected to the screw rod portion, where the first fixed portion and the second fixed portion are spaced apart from each other along the second direction on the fixing mechanism, and the nut portion is fixedly connected to the synchronization member.

With the above technical solution adopted, the screw rod portion rotates around its axis relative to the first fixed portion and the second fixed portion, and the nut portion is threadedly engaged with the screw rod portion. Since the nut portion is connected to the synchronization member, when reciprocating along the axial direction of the screw rod portion, the nut portion also drives the synchronization member to reciprocate.

In some embodiments, the guide slots are disposed in mirror symmetry with respect to the central axis of the screw rod portion.

With the above technical solution adopted, interaction forces between the guide slots and their corresponding limiting members allow for more uniform forces applied to the synchronization member, making the synchronization member move more smoothly relative to the fixing mechanism.

In some embodiments, the test apparatus further includes a support frame, where the fixing mechanism is slidably connected to the support frame and capable of sliding along a second direction relative to the support frame.

With the above technical solution adopted, the support frame plays the role of carrying to satisfy freedom of movement of the test probe mechanisms along the second direction, so as to adapt to battery cells of different dimensions.

In some embodiments, the test apparatus further includes a driving mechanism, where a fixed end of the driving mechanism is connected to the support frame, an output end of the driving mechanism is connected to the fixing mechanism, and the driving mechanism drives the fixing mechanism to reciprocate along the second direction relative to the support frame.

With the above technical solution adopted, the driving mechanism serves as a power source so that the fixing mechanism moves more easily along the second direction relative to the support frame.

In some embodiments, the test probe mechanism includes a connecting member slidably connected to the fixing mechanism and two test members connected to an end of the connecting member away from the fixing mechanism.

With the above technical solution adopted, the two test members respectively abut against a positive pole and a negative pole of a battery cell for testing, and the connecting member drives the two test members to slide relative to the fixing mechanism.

In some embodiments, at least one of the test members is slidably connected to the connecting member in a third direction, the third direction being perpendicular to the first direction.

With the above technical solution adopted, the test members can be used to obtain freedom of movement along the third direction, so as to further adapt to test requirements of battery cells of different dimensions.

In some embodiments, the connecting member includes a vertical portion slidably connected to the fixing mechanism and a horizontal portion perpendicularly connected to the vertical portion, and the test members are fitted on the horizontal portion and slide relative to the horizontal portion.

With the above technical solution adopted, the horizontal portion is parallel to the third direction, and the test member are slidably connected to the horizontal portion.

In some embodiments, the test member includes a test body and a probe provided on the test body, where the test body is slidably connected to the connecting member, one end of the probe abuts against an electrode terminal of the battery cell, and the other end of the probe is electrically connected to an external test device.

With the above technical solution adopted, the probe moves along with the test body to adapt to test requirements of battery cells with different pole-to-pole distances.

In some embodiments, at least two probes are provided, and the probes are spaced apart along the first direction.

With the above technical solution adopted, the probe count is increased, and the placement of the probes is clarified, so as to improve the acquisition accuracy of poles of a corresponding battery cell by the test member.

In some embodiments, the test probe mechanism further includes locking members for locking the test members, where the locking member is inserted through the test member and capable of abutting against the connecting member.

With the above technical solution adopted, the locking member is used to lock the position of the test member relative to the connecting member, so that the test member and the connecting member remain relatively stationary.

According to a second aspect, an embodiment of this application further provides a battery production line including the foregoing test apparatus.

For the battery production line provided in this embodiment of this application, on the basis of having the foregoing test apparatus, the battery production line has higher production efficiency.

BRIEF DESCRIPTION OF DRAWINGS

To describe the technical solutions of the embodiments of this application more clearly, the following briefly describes the accompanying drawings required for describing the embodiments or the related art. Apparently, the accompanying drawings described below show merely some embodiments of this application, and persons of ordinary skill in the art may still derive other drawings from these accompanying drawings without creative efforts.

REFERENCE SIGNS IN THE DRAWINGS

Figure 1:
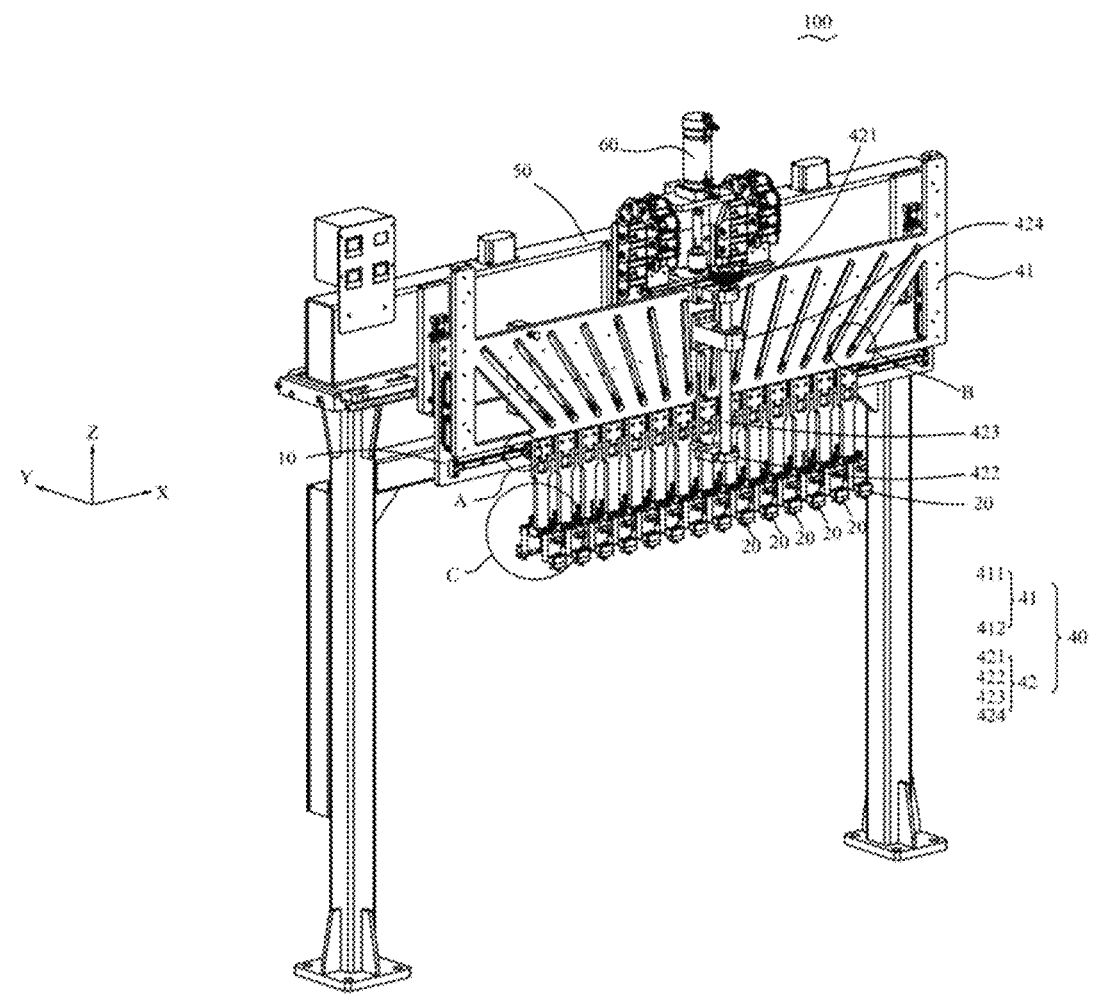
FIG. 1 is a schematic structural diagram of a test apparatus according to some embodiments of this application.

100. test apparatus;
10. fixing mechanism;

20. test probe mechanism; 21. connecting member; 22. test member; 211. vertical portion; 212. horizontal portion; 221. test body; 222. probe; 23. locking member; 231. locking bolt; 232. stud;

30. sliding mechanism; 31. guide rail; 32. slider;

40. synchronization mechanism; 41. synchronization member; 42. driving member; 411. guide slot; 412. limiting member; 411*a*. first slot end; 411*b*. second slot end; 421. first fixed portion; 422. second fixed portion; 423. screw rod portion; 424. nut portion;

41*a*. rotating shaft; 42*a*1. box body; 42*a*2. motor; 41*a*1. slot structure; 42*a*1. opening; 43. block; 44. connecting column;

50. support frame;

60. driving mechanism;

first direction X; second direction Z; third direction Y;

1000. battery production line; 200. delivery mechanism; 300. transfer mechanism; 400. battery cell; and 401. electrode terminal.

DESCRIPTION OF EMBODIMENTS

The embodiments of this application are described in detail below. Examples of the embodiments are shown in the accompanying drawings, and reference signs that are the same or similar always indicate the same or similar components or components with the same or similar functions. The embodiments described below with reference to the drawings are illustrative and intended to explain this application. They should not be construed as limitations on this application.

Unless otherwise defined, all technical and scientific terms used herein shall have the same meanings as commonly understood by those skilled in the art to which this application pertains. The terms used herein are intended to merely describe the specific embodiments rather than to limit this application. The terms "include", "comprise", and "have" and any other variations thereof in the specification, claims, and brief description of drawings of this application are intended to cover non-exclusive inclusions.

In the description of the embodiments of this application, the orientations or positional relationships indicated by the technical terms "length", "width", "thickness", "inside", "outside", "upper", "lower", "left", "right", and the like are based on the orientations or positional relationships as shown in the accompanying drawings. These terms are merely for ease and brevity of the description of this application rather than indicating or implying that the means or components mentioned must have specific orientations, or must be constructed or manipulated according to specific orientations, and therefore shall not be construed as any limitations on this application.

The terms "first", "second", and the like are merely for distinguishing purposes, and shall not be understood as any indication or implication of relative importance or any implicit indication of the number of technical features indicated. For example, a first guide member and a second guide member are merely intended to distinguish different guide members rather than to limit an order thereof, and the first guide member may also be named the second guide member and the second guide member may also be named the first guide member without departing from the scope of various described embodiments. In addition, the terms "first", "second", and the like do not limit that the indicated features are necessarily different either.

In the description of the embodiments of this application, unless otherwise specified and defined explicitly, the terms "connection", "join", and the like should be understood in their general senses. For example, they may refer to a fixed connection, a detachable connection, or an integral connection, may refer to a mechanical connection or an electrical connection, and may refer to a direct connection, an indirect connection via an intermediate medium, an internal communication between two elements, or an interaction between two elements. Persons of ordinary skills in the art can understand specific meanings of these terms in this application as appropriate to specific situations. "A plurality of" means at least two, that is, two or more.

In this application, "and/or" is only an associative relationship for describing associated objects, indicating that three relationships may be present. For example, A and/or B may indicate the following three cases: presence of only A, presence of both A and B, and presence of only B. In addition, the character "/" in this specification generally indicates an "or" relationship between contextually associated objects.

It should be noted that in this application, the words "in some embodiments", "in an example", "for example", and the like are used to indicate making an example, example illustration, or explanation. Any embodiment or design solution described as "in some embodiments", "in an example", or "for example" in this application shall not be interpreted as being preferable or superior to other embodiments or design solutions. In this specification, the words "in some embodiments", "in an example", "for example", and the like are intended to present relevant concepts in a specific manner, meaning that specific features, structures or characteristics described with reference to the embodiment may be incorporated in at least one embodiment of this application. The foregoing words appearing in various places in the specification does not necessarily refer to the same embodiment or an independent or alternative embodiment that is exclusive of other embodiments. It is explicitly or implicitly understood by persons skilled in the art that the embodiments described herein may be combined with other embodiments.

To make the objectives, technical solutions, and advantages of this application more comprehensible, the following describes this application in detail with reference to the embodiments and accompanying drawings.

After going through processes such as formation, grading, and labeling, batteries further need to undergo an OCV (open circuit voltage) test, through which parameters of the battery such as K value (K value is the voltage drop of the battery cell per unit time, reflecting the self-discharge rate of the battery cell), current, voltage, and capacity can be obtained, so as to screen out a battery with unqualified electrochemical parameters, ensuring the quality of each batch of batteries.

Generally, batteries undergo the OCV test in a flow process, to be specific, batteries are placed in batches on a transport line, and the OCV test can be performed on dozens or even more batteries at a time. However, dimensions of batteries are differentiated, for example, length, width, and height of batteries in different batches may all be different. Therefore, when batteries of different dimensions in batches undergo the OCV test, the distance between test probes need to be continuously adjusted for adaptation. For example, thickness of batteries in the current batch is A mm, and the batteries are placed side by side at a certain distance on a tray to complete the OCV test process. However, thickness size of batteries in the next batch is B mm, and the distance between the batteries on the tray needs to be adjusted to some extent, or the distance between the probes for OCV test needs to be adjusted accordingly to meet the OCV test requirements of the batteries in this batch. In this case, test efficiency in this process is reduced. Therefore, how corresponding test conditions are quickly responded and adapted to is an urgent problem to be solved, especially for batteries of different dimensions.

This application provides a test apparatus that can be configured to test incoming battery cells in batches, for example, performing OCV test. The test apparatus includes a fixing mechanism and a plurality of test probe mechanisms. The fixing mechanism provides connection and support for connecting the test probe mechanisms. The fixing mechanism may remain stationary or may be connected to an external drive apparatus to obtain a corresponding degree of freedom. The test probe mechanisms are disposed on the fixing mechanism side by side along a first direction, and the test probe mechanisms can slide relative to the fixing mechanism along the first direction. In this way, the distances between the test probe mechanisms can be adjusted to satisfy different dimensions of battery cells in different batches, that is, to satisfy the battery cell OCV test in which one of the length, width, or height of the battery cells is a variable. This reduces the time spent on arranging the positions of the battery cells before test, thereby improving the test efficiency. Certainly, it can be understood that the test apparatus may also be used in other test scenarios.

Figure 8:
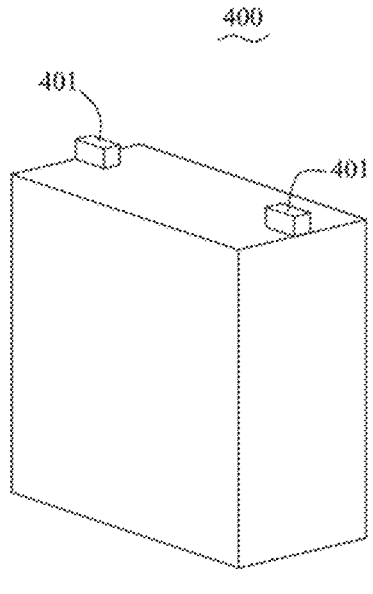
FIG. 8 is a schematic structural diagram of a battery cell according to some embodiments of this application.

Referring to FIG. 1 and FIG. 8, FIG. 1 is a schematic structural diagram of a test apparatus according to an embodiment of this application, and FIG. 8 is a schematic structural diagram of a battery cell according to an embodiment of this application.

The test apparatus 100 can be configured to test incoming battery cells 400, for example, performing OCV test and temperature test, and includes a fixing mechanism 10 and a plurality of test probe mechanisms 20. The test probe mechanisms are slidably connected to the fixing mechanism 10 side by side along a first direction X.

It can be understood that the fixing mechanism 10 provides connection and support for the test probe mechanisms 20. During disposition, the fixing mechanism 10 may remain stationary or may be connected to an external drive apparatus to obtain a corresponding degree of spatial freedom. For example, the fixing mechanism 10 may be a mechanism similar to a gantry support, erected at an OCV test position of an incoming production line. Alternatively, the fixing mechanism 10 may be similar to a plate structure or block structure, and such plate structure or block structure may be connected to an external drive apparatus. The external drive apparatus includes but is not limited to a telescopic cylinder, a screw rod mechanism, a lifting mechanism, or a rotary mechanism. In this way, the plate structure or block structure can obtain spatial freedom of movement or freedom of rotation.

That the test probe mechanisms 20 can be slidably connected to the fixing mechanism 10 may be that the test probe mechanisms 20 are directly slidably connected to the fixing mechanism 10. For example, the fixing mechanism 10 is provided with a guide structure such as a sliding slot or a sliding rail, and the test probe mechanism 20 is provided with a sliding structure that is adapted to the guide structure, the sliding structure including but not limited to a bump or a rib. The sliding structure is adapted to the guide structure so that all the test probe mechanisms 20 can slide on the fixing mechanism 10.

Alternatively, the test probe mechanisms 20 are slidably connected to the fixing mechanism 10 via a sliding mechanism. The sliding mechanism includes a guide rail and sliders that are slidably adapted to the guide rail. The guide rail is provided on the fixing mechanism 10 along the first direction X, and the test probe mechanisms 20 are slidably connected to the guide rail via the sliders to meet the requirement of sliding relative to the fixing mechanism 10.

The first direction X is the arrangement direction of the test probe mechanisms 20, and the first direction X is also related to the arrangement of the incoming battery cells 400. For example, when electrode terminals 401 of the incoming battery cell 400 are provided on an end surface where thickness and length of the battery cell 400 are located, the first direction X may be the thickness direction or length direction of the incoming battery cell 400; when the electrode terminals 401 of the incoming battery cell 400 are provided on an end surface where width and length of the battery cell 400 are located, the first direction X may be the width direction or length direction of the incoming battery cell 400; or when the electrode terminals 401 of the incoming battery cell 400 are provided on an end surface where thickness and width of the battery cell 400 are located, the first direction X may be the thickness direction or width direction of the incoming battery cell 400. In this way, the test probe mechanisms can slide along the first direction X to adapt to a single variable in the length, width, or thickness of the incoming battery cells 400.

It should be noted that the test probe mechanism 20 can slide forward or backward relative to the fixing mechanism 10, that is, the test probe mechanism 20 can reciprocate along the first direction X. In this way, whether sliding forward or backward along the first direction X, the test probe mechanism 20 slides along the first direction X.

In addition, correlation of sliding of the test probe mechanisms 20 on the fixing mechanism 10 includes but is not limited to mutually independent sliding or synchronous sliding.

It can be understood that the mutually independent sliding of the test probe mechanisms 20 relative to the fixing mechanism 10 means that the test probe mechanisms 20 do not affect each other when sliding relative to the fixing mechanism 10, that is, any one of the test probe mechanisms 20 can move any distance along the forward direction or backward direction of the first direction X, and in this way, can be used for conducting the OCV test on battery cells 400 of various different dimensions in the same batch, suitable for test conducted in an experimental test environment.

Alternatively, the test probe mechanisms 20 may slide synchronously relative to the fixing mechanism 10. Herein, synchronous sliding may refer to that some of the test probe mechanisms 20 slide synchronously, or all of the test probe mechanisms 20 slide synchronously. In addition, the test probe mechanisms 20 that slide synchronously may move synchronously along the forward direction or backward direction of the first direction X. A characteristic of synchronous movement is that it can achieve consistency in the movement distances of the test probe mechanisms 20 and can quickly allow the test probe mechanisms 20 to exhibit an equally spaced arrangement along the first direction X, suitable for test conducted in an actual production environment.

In the test apparatus 100 provided in this embodiment of this application, the fixing mechanism 10 is provided with a plurality of test probe mechanisms 20, and the test probe mechanisms 20 can slide along the first direction X relative to the fixing mechanism 10. In this way, distances between the test probe mechanisms 20 can be adaptively adjusted according to the dimensions of to-be-tested battery cells 400, that is, the distances can quickly respond and adapt to changes in dimensions of incoming battery cells 400, so that the test efficiency can be significantly improved.

In some embodiments, each of the test probe mechanisms 20 is capable of independently sliding along the first direction X relative to the fixing mechanism 10.

It can be understood that the test probe mechanisms 20 slide along the first direction X without affecting each other, to be specific, any one of the test probe mechanisms 20 can slide along the forward direction or backward direction of the first direction X relative to the fixing mechanism 10, and the distances between this test probe mechanism 20 and its two neighboring test probe mechanisms 20 can also be arbitrarily adjusted.

The sliding form between the test probe mechanism 20 and the fixing mechanism 10 may be direct sliding, indirect sliding, partially direct sliding, or partially indirect sliding.

For example, the fixing mechanism 10 is provided with a sliding slot extending along the first direction X, and each test probe mechanism 20 is provided with a convex portion adapted to the sliding slot. The convex portion is utilized to slide in the sliding slot to realize sliding of the test probe mechanisms 20 relative to the fixing mechanism 10, and the sliding direction and sliding distance are not limited.

For example, the fixing mechanism 10 is provided with a sliding rail, and each test probe mechanism 20 is provided with a slider that is slidably connected to the sliding rail. The sliding fit between the slider and the sliding rail is used to realize sliding of the test probe mechanisms 20 relative to the fixing mechanism 10, and the sliding direction and sliding distance are not limited.

In this way, the distances between the test probe mechanisms 20 can be arbitrarily adjusted to adapt to test requirements of battery cells 400 of different dimensions in the same batch. For example, for battery cells 400 of different widths in the same batch, the distances between the test probe mechanisms 20 corresponding to the battery cells 400 can be adjusted for relative adaptation. In this way, the test requirements in the experimental test environment can be better adapted to, and the test apparatus 100 can complete the OCV test for battery cells 400 of different dimensions at one time.

In some embodiments, at least some of the test probe mechanisms 20 slide synchronously along the first direction X relative to the fixing mechanism 10.

It can be understood that the synchronous sliding relative to the fixing mechanism 10 means that the test probe mechanisms 20 can maintain synchronization during sliding, for example, starting sliding synchronously, sliding synchronously, and stopping sliding synchronously. In addition, it may be that some or all of the test probe mechanisms 20 slide synchronously. Moreover, the synchronous sliding may be sliding along the forward direction of the first direction X or sliding along the backward direction of the first direction X.

The sliding form between the test probe mechanism 20 and the fixing mechanism 10 may be direct sliding, indirect sliding, partially direct sliding, or partially indirect sliding.

For example, the fixing mechanism 10 is provided with a sliding slot extending along the first direction X, and each test probe mechanism 20 is provided with a convex portion adapted to the sliding slot. The convex portion is utilized to slide in the sliding slot to realize sliding of the test probe mechanisms 20 relative to the fixing mechanism 10, and the sliding direction and sliding distance are not limited.

For example, the fixing mechanism 10 is provided with a sliding rail, and each test probe mechanism 20 is provided with a slider that is slidably connected to the sliding rail. The sliding fit between the slider and the sliding rail is used to realize sliding of the test probe mechanisms 20 relative to the fixing mechanism 10, and the sliding direction and sliding distance are not limited.

Since at least some of the test probe mechanisms 20 can maintain synchronization before, during, and after sliding, the relative positions of the test probe mechanisms 20 with respect to the fixing mechanism 10 can be arranged.

For example, the initial positions of the test probe mechanisms 20 relative to the fixing mechanism 10 do not satisfy equally spaced arrangement, and the synchronization of sliding can allow the positions of the test probe mechanisms 20 during sliding or after sliding relative to the fixing mechanism 10 to satisfy maintained equally spaced arrangement, so as to meet the test requirements of battery cells 400 of the same specification in the same batch.

Alternatively, the initial positions of the test probe mechanisms 20 relative to the fixing mechanism 10 satisfy equally spaced arrangement, and the synchronization of sliding can allow the positions of the test probe mechanisms 20 during sliding or after sliding relative to the fixing mechanism 10 to satisfy maintained non-equally spaced arrangement, so as to meet the test requirements of battery cells 400 of different dimensions in the same batch.

With such arrangement, the test probe mechanisms 20 can slide to corresponding preset positions at the same time, so that the battery cells 400 can be quickly tested.

In some embodiments, the test probe mechanisms 20 slide synchronously along the first direction X relative to the fixing mechanism 10 and are arranged equidistantly.

It can be understood that the test probe mechanisms 20 slide synchronously relative to the fixing mechanism 10, and ultimately the test probe mechanisms 20 are arranged equidistantly along the first direction X.

Specifically, the sliding form between the test probe mechanism 20 and the fixing mechanism 10 is indirect sliding. To be specific, the relative sliding of the two is realized by adding a sliding structure, in which case sliding stability of the test probe mechanism 20 is higher, facilitating realization of the final result of equally spaced arrangement.

For example, the fixing mechanism 10 is provided with a sliding rail, and each test probe mechanism 20 is provided with a slider that is slidably connected to the sliding rail. The sliding fit between the slider and the sliding rail is used to realize sliding of the test probe mechanisms 20 relative to the fixing mechanism 10, and the sliding direction and sliding distance are not limited.

With such arrangement, the test probe mechanisms 20 can slide to corresponding preset positions at the same time, and the preset positions satisfy that distances between the test probe mechanisms 20 are equal, so that battery cells 400 of the same dimensions in the same batch can be quickly tested.

Figure 2:
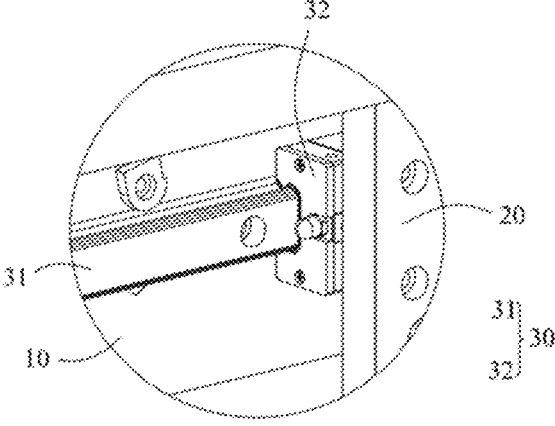
FIG. 2 is an enlarged view of position A in FIG. 1.

Referring to FIG. 2, in some embodiments, the test apparatus 100 includes a sliding mechanism 30, where the sliding mechanism 30 includes a guide rail 31 provided on the fixing mechanism 10 and sliders 32 provided on corresponding test probe mechanisms 20, the sliders 32 being slidably connected to the guide rail 31.

Herein, the sliding form between the fixing mechanism 10 and the test probe mechanism 20 is indirect sliding, to be specific, the relative sliding of the two is realized via the sliding mechanism 30. Specifically, the guide rail 31 is disposed on the fixing mechanism 10 along the first direction X, each test probe mechanism 20 is provided with a slider 32, and each slider 32 is slidably connected to the guide rail 31.

With such arrangement, the sliders 32 in the sliding mechanism 30 are used to slide adaptively on the guide rail 31 to satisfy that the test probe mechanisms 20 slide along the first direction X relative to the fixing mechanism 10.

In other embodiments, the fixing mechanism 10 may be provided with a plurality of guide rails 31 that are spaced apart, and the test probe mechanism 20 is provided with a plurality of sliders 32 slidably adapted thereto. In this way, the sliding fit between the plurality of sliders 32 and each guide rail 31 further enhances the sliding stability of the test probe mechanisms 20 on the fixing mechanism 10.

Referring to FIG. 1, in some embodiments, the test apparatus 100 further includes a synchronization mechanism 40, where the synchronization mechanism 40 includes a synchronization member 41 that is connected to the test probe mechanisms and a driving member 42 that drives the synchronization member 41 to move relative to the fixing mechanism 10, and the synchronization member 41 drives, during movement relative to the fixing mechanism 10, the test probe mechanisms 20 to slide synchronously.

It can be understood that the synchronization mechanism 40 is configured to realize the synchronous sliding of the test probe mechanisms 20 along the first direction X. Herein, the synchronization mechanism 40 capable of realizing the synchronous sliding of the test probe mechanisms 20 shall include the synchronization member 41 and the driving member 42. The synchronization member 41 is configured to be connected to the test probe mechanisms 20 and play the role of synchronous driving, and the driving member 42 serves as a power source to drive the synchronization member 41 to move relative to the fixing mechanism 10, where the moving synchronization member 41 drives the test probe mechanisms 20 to slide synchronously.

For example, as shown in FIG. 1, the synchronization member 41 may be similar to a plate structure or a block structure, and each test probe mechanism 20 is slidably connected to the synchronization member 41, that is, relative sliding can occur between the two. Herein, the sliding form between the synchronization member 41 and the test probe mechanism 20 may be direct sliding or indirect sliding. For example, the synchronization member 41 is provided with a plurality of sliding slots, and each test probe mechanism 20 is slidably connected to a corresponding sliding slot. The driving member 42 includes but is not limited to a screw rod mechanism, a lifting mechanism, a telescopic cylinder, or a servo motor, and the driving member 42 drives the synchronization member 41 to move up and down along the gravity direction, allowing the test probe mechanisms 20 to slide synchronously along the first direction X.

Figure 5:
FIG. 5 is a schematic structural diagram of a synchronization mechanism of a test apparatus according to some other embodiments of this application.
Figure 5:
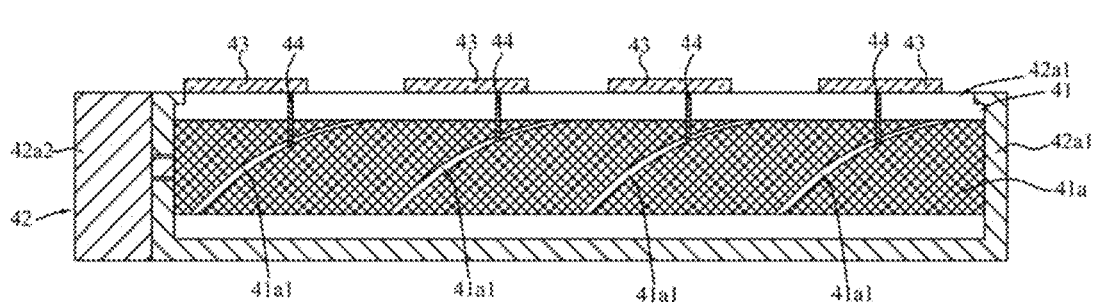

For example, as shown in FIG. 5, the synchronization member 41 includes a rotating shaft 41*a*, and the driving member 42 includes a box body 42*a*1 and a motor 42*a*2 disposed at an end of the box body 42*a*1. The rotating shaft 41*a* is rotatably connected to the interior of the box body 42*a*1 and is connected to an output end of the motor 42*a*2, and the rotating shaft 41*a* is provided with a plurality of helically distributed slot structures 41*a*1. The box body 42*a*1 is provided with an opening 42*a*1 connected to the outside on a side surface, and a plurality of blocks 43 are slidably connected onto this side surface of the box body 42*a*1, where the block 43 is provided with a connecting column 44, and the connecting column 44 extends into the box body 42*a*1 through the opening 42*a*1 and fits with the slot structure 41*a*1. In this way, driven by the motor 42*a*2, the rotating shaft 41*a* rotates around its own axis relative to the box body 42*a*1, the connecting column 44 slides relative to the box body 42*a*1 under the limit of the slot structure 41*a*1, and each test probe mechanism 20 is connected to a corresponding block 43. In this embodiment, the rotating shaft 41*a* is disposed in the first direction X and rotates around its own axis relative to the fixing mechanism 10.

With such arrangement, the driving member 42 is used to drive the synchronization member 41 to move relative to the fixing mechanism 10, so that the test probe mechanisms 20 slide synchronously, thereby improving the test efficiency.

Figure 3:
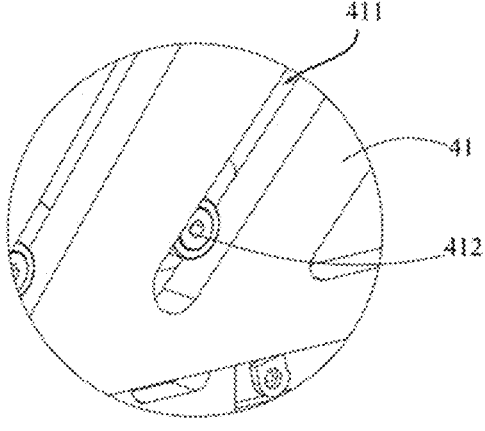
FIG. 3 is an enlarged view of position B in FIG. 1.
Figure 4:
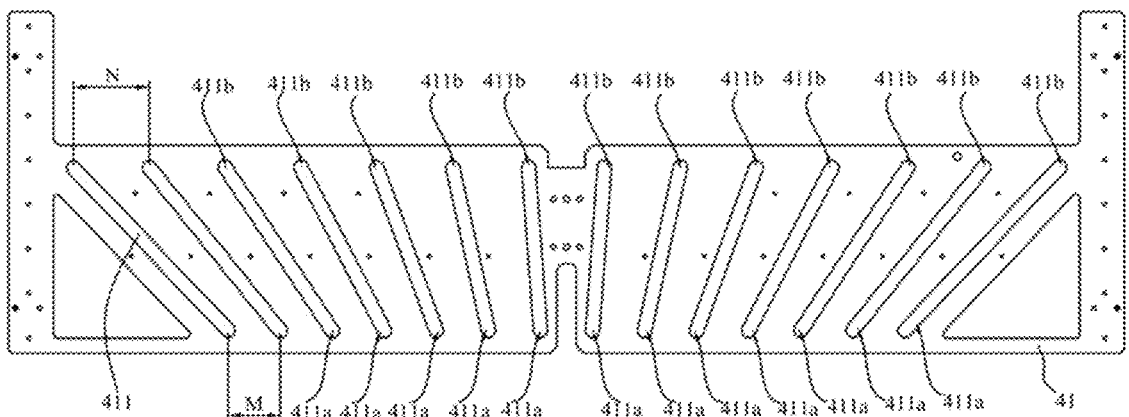
FIG. 4 is a schematic structural diagram of a synchronization member of a test apparatus according to some embodiments of this application.

Referring to FIG. 1, FIG. 3, and FIG. 4, in a specific embodiment, the synchronization member 41 is slidably connected to the fixing mechanism 10 in a second direction Z, the synchronization member 41 is provided with a plurality of guide slots 411 corresponding to the test probe mechanisms 20, and the test probe mechanism is provided with a limiting member 412 slidably connected to the guide slot 411, the second direction Z being perpendicular to the first direction X.

It can be understood that based on the arrangement of electrode terminals 401 of the incoming battery cell 400, when the electrode terminals 401 are provided on an end surface where thickness and length of the battery cell 400 are located, the first direction X may be the thickness direction or length direction of the incoming battery cell 400, and the second direction Z is the width direction of the battery cell 400; when the electrode terminals 401 are provided on an end surface where width and length of the battery cell 400 are located, the first direction X may be the width direction or length direction of the incoming battery cell 400, and the second direction Z is the thickness direction of the battery cell 400; or when the electrode terminals 401 are provided on an end surface where thickness and width of the battery cell 400 are located, the first direction X may be the thickness direction or width direction of the incoming battery cell 400, and the second direction Z is the length direction of the battery cell 400.

The sliding form between the synchronization member 41 and the fixing mechanism 10 may be direct sliding or indirect sliding, for example, the relative sliding of the two is realized via a guide rail mechanism. In addition, the driving member 42 drives the synchronization member 41 to reciprocate along the second direction Z relative to the fixing mechanism 10. Similarly, whether sliding forward or backward along the second direction Z, the synchronization member 41 slides along the second direction Z.

The guide slots 411 shall be in a plane where the first direction X and the second direction Z are located, and the guide slots 411 include but are not limited to inclined straight slots, arc-shaped slots, or a combination of inclined straight slots and arc-shaped slots. An extension direction of the guide slot 411 is at an angle with the second direction Z. Herein, the extension direction of the guide slot is a direction of a line connecting two ends of the guide slot. The guide slots 411 may be arranged in a same direction on the synchronization member 41, to be specific, the included angles between the extension directions of the guide slots 411 and the second direction Z are all acute angles or obtuse angles. In this case, driven by the synchronization member 41, the corresponding test probe mechanisms 20 slide synchronously along the forward direction or backward direction of the first direction X. Alternatively, the guide slots 411 may be arranged in opposite directions on the synchronization member 41, to be specific, the included angles between the extension directions of part of the guide slots 411 and the second direction Z are acute angles, and the included angles between the extension directions of the other part of the guide slots 411 and the second direction Z are obtuse angles. In this case, driven by the synchronization member 41, test probe mechanisms 20 corresponding to the guide slots 411 that have acute included angles of their extension directions with the second direction Z slide synchronously along the forward direction of the first direction X, and test probe mechanisms 20 corresponding to the guide slots 411 that have obtuse included angles of their extension directions with the second direction Z slide synchronously along the backward direction of the first direction X. Certainly, the correspondences can be exchanged.

The limiting member 412 is limited to slide in the guide slot 411, and according to the slot shape of the guide slot 411, the limiting member 412 includes but is not limited to a limiting column, a limiting block, or a limiting pipe.

Optionally, the limiting member 412 is a screw and is connected to the test probe mechanism 20 in a screwing manner, and a rod portion or nut portion of the screw can be limited to slide in the guide slot 411, thereby realizing the synchronous movement of the synchronization member 41 and the test probe mechanisms 20.

For example, as shown in FIG. 4, the guide slots 411 are all inclined straight slots, and the guide slots 411 are equally divided into two groups. The synchronization member 41 has a symmetrical structure with the symmetrical center line of the synchronization member 41 as the center of symmetry, and the guide slots 411 are distributed in a mirrored pattern on the synchronization member 41. In this case, the included angles between the extension directions of part of the guide slots 411 and the second direction Z are acute angles, and in the first direction X, a guide slot 411 farther away from the symmetrical center line of the synchronization member 41 has larger acute included angle of its extension direction with the second direction Z. Similarly, the included angles between the extension directions of part of the guide slots 411 and the second direction Z are obtuse angles, and in the first direction X, a guide slot 411 farther away from the symmetrical center line of the synchronization member 41 has larger obtuse included angle of its extension direction with the second direction Z. In this way, when the synchronization member 41 reciprocates along the second direction Z relative to the fixing mechanism 10, test probe mechanisms 20 corresponding to the guide slots 411 that have acute included angles of their extension directions with the second direction Z slide synchronously along the forward direction of the first direction X, and test probe mechanisms 20 corresponding to the guide slots 411 that have obtuse included angles of their extension directions with the second direction Z slide synchronously along the backward direction of the first direction X. The entire synchronous sliding process is smooth.

With such arrangement, the limiting members 412 are used to slide in the guide slots 411 to limit sliding trajectories of the test probe mechanisms 20, that is, the test probe mechanisms 20 slide synchronously along the first direction X relative to the fixing mechanism 10.

Referring to FIG. 4, in some embodiments, the guide slot 411 is provided with a first slot end 411a and a second slot end 411b, and the limiting member 412 slides reciprocally between the first slot end 411a and the second slot end 411b.

Herein, the slot end of the guide slot 411 refers to a start position or end position of the guide slot 411, the two slot ends are identical and communicate with each other, and the limiting member 412 slides in the guide slot 411. The first slot end is the start position of the guide slot 411, and the second slot end 411b is the end position of the guide slot 411. The limiting member 412 on each test probe mechanism 20 slides reciprocally between the first slot end 411a and the second slot end 411b of the corresponding guide slot 411. It can be understood that when the limiting member 412 is located at the first slot end 411a, the test probe mechanism 20 is at a first position on the fixing mechanism 10, and when the limiting member 412 is located at the second slot end 411b, the test probe mechanism 20 is at a second position on the fixing mechanism 10. Herein, the test probe mechanism 20 may be at the first position, the second position, or an intermediate position between the first position and the second position for the OCV test on the incoming battery cell 400.

Referring to FIG. 4, in some embodiments, distances M between first slot ends 411a of any adjacent two of the guide slots 411 are equal; and/or distances N between second slot ends 411b of any adjacent two of the guide slots 411 are equal.

It can be understood that the guide slot 411 is typically processed and shaped with a milling tool, then the geometric center of the first slot end 411a is a rotating center of the milling tool, and similarly, the geometric center of the second slot end 411b is another rotating center of the milling tool. Therefore, a distance M between the first slot ends 411a of two guide slots 411 is a distance between the geometric centers of the two first slot ends 411a, and similarly, a distance N between the second slot ends 411b of two guide slots 411 is a distance between the geometric centers of the two second slot ends 411b.

In this way, the guide slots 411 have equal distances M between the first slot ends 411a, then the distances between the corresponding test probe mechanisms 20 are also equal, that is, the test probe mechanisms 20 have equal distances between the start positions, and therefore are suitable for testing battery cells 400 of the same specification in the same batch.

Similarly, the guide slots 411 have equal distances N between the second slot ends 411b, then the distances between the corresponding test probe mechanisms 20 are also equal, that is, the test probe mechanisms 20 have equal distances between the end positions, and therefore are suitable for testing battery cells 400 of the same specification in the same batch.

Referring to FIG. 1, in some embodiments, the driving member 42 includes a first fixed portion 421, a second fixed portion 422, a screw rod portion 423 with two ends connected to the first fixed portion 421 and the second fixed portion 422 respectively, and a nut portion threadedly connected to the screw rod portion 423, where the first fixed portion 421 and the second fixed portion 422 are spaced apart from each other along the second direction Z on the fixing mechanism 10, and the nut portion is fixedly connected to the synchronization member 41.

It can be understood that the first fixed portion 421 and the second fixed portion 422 are components that have fixed relative positions in the driving member 42, the first fixed portion 421 and the second fixed portion 422 may be block structures or strip structures, and the two are configured to be fixed to the fixing mechanism 10, for example, the first fixed portion 421 and the second fixed portion 422 may be connected to the fixing mechanism 10 via fasteners such as screws and pins.

The screw rod portion 423 is provided with an external thread and is threadedly engaged with the nut portion 424. The screw rod portion 423 rotates along the direction of its own axis and is engaged with the nut portion 424 during rotation for connecting the nut portion 424 and the synchronization member 41, allowing the synchronization member 41 to reciprocate along the second direction Z under the driving of the nut portion 424.

The nut portion 424 is a structural member with an internal thread and is threadedly engaged with the screw rod portion 423. The nut portion 424 may be a non-standard nut or a block with an internal thread. While satisfying engagement with the screw rod portion 423, the nut portion 424 also needs to be connected to the synchronization member 41.

Herein, the screw rod portion 423 may rotate around its own axial direction manually or rotate automatically around its axis by means of mechanical transmission. For example, when the screw rod portion 423 rotates clockwise around its axis, the nut portion 424 drives the synchronization member 41 to move along the forward direction of the second direction Z; and when the screw rod portion 423 rotates counterclockwise around its axis, the nut portion 424 drives the synchronization member 41 to move along the backward direction of the second direction Z.

With such arrangement, the screw rod portion 423 rotates around its axis relative to the first fixed portion 421 and the second fixed portion 422, and the nut portion 424 is threadedly engaged with the screw rod portion 423. Since the nut portion 424 is connected to the synchronization member 41, when reciprocating along the axial direction of the screw rod portion 423, the nut portion 424 also drives the synchronization member 41 to reciprocate along the second direction Z.

Referring to FIG. 1 and FIG. 4, in some embodiments, the guide slots 411 are disposed in mirror symmetry with respect to the central axis of the screw rod portion 423.

It can be understood that the screw rod portion 423 of the driving portion is located at the center of symmetry of the synchronization member 41, and when the screw rod portion 423 rotates around its axis, the synchronization member 41 reciprocates along the second direction Z under the driving of the nut portion 424. Since the guide slots 411 are disposed in mirror symmetry with respect to the central axis of the screw rod portion 423, the movement trajectories of the limiting members 412 on the test probe mechanisms 20 in the corresponding guide slots 411 are also symmetrical. In this way, the interaction forces between the guide slots 411 and the corresponding limiting members 412 apply a more uniform force to the synchronization member 41, such that the synchronization member 41 moves more smoothly relative to the fixing mechanism 10.

For example, the guide slot 411 is an inclined straight slot, and every two guide slots 411 form a group and are symmetrically distributed on the synchronization member 41 with respect to the central axis of the screw rod portion 423. In addition, a guide slot 411 farther away from the central axis of the screw rod portion 423 has larger included angle with the second direction Z. This helps the test probe mechanisms 20 disperse along the first direction X under the driving of the limiting member and be spaced apart from each other.

Referring to FIG. 1, in some embodiments, the test apparatus 100 further includes a support frame 50, where the fixing mechanism 10 is slidably connected to the support frame 50 and capable of sliding along a second direction Z relative to the support frame 50.

Herein, the support frame 50 plays the role of carrying to satisfy freedom of movement of the test probe mechanisms 20 along the second direction Z. The sliding form between the support frame 50 and the fixing mechanism 10 may be direct sliding, indirect sliding, partially direct sliding, or partially indirect sliding.

For example, the support frame 50 is provided with a sliding rail, and the fixing mechanism 10 is provided with a slider that is slidably connected to the sliding rail. The sliding fit between the slider and the sliding rail is used to realize sliding of the fixing mechanism 10 relative to the support frame 50, and the sliding direction and sliding distance are not limited.

Referring to FIG. 1, in some embodiments, the test apparatus 100 further includes a driving mechanism 60, where a fixed end of the driving mechanism 60 is connected to the support frame 50, an output end of the driving mechanism 60 is connected to the fixing mechanism 10, and the driving mechanism 60 drives the fixing mechanism 10 to reciprocate along the second direction Z relative to the support frame 50.

It can be understood that the driving mechanism 60 is configured to serve as a power source to drive the fixing mechanism 10 to move along the second direction Z relative to the support frame 50, featuring easier moving process.

Herein, the driving mechanism 60 includes but is not limited to a screw rod mechanism, a cylinder mechanism, a lifting mechanism, or a servo motor.

Figure 6:
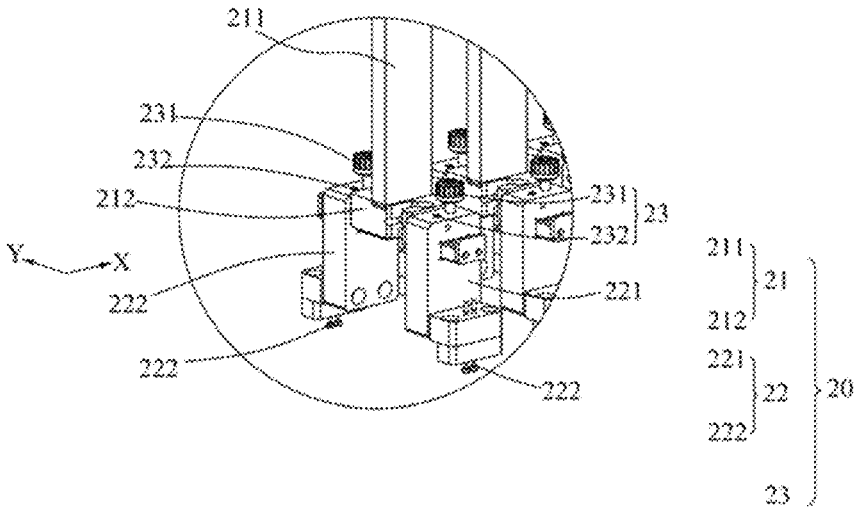
FIG. 6 is an enlarged view of position C in FIG. 1.

Referring to FIG. 1, FIG. 6, and FIG. 8, in some embodiments, the test probe mechanism 20 includes a connecting member 21 slidably connected to the fixing mechanism 10 and two test members 22 connected to an end of the connecting member 21 away from the fixing mechanism 10.

It can be understood that the connecting member 21 plays the role of carrying and connecting the test member 22. In addition, the sliding form between the connecting member 21 and the fixing mechanism 10 may be direct sliding, indirect sliding, partially direct sliding, or partially indirect sliding. For example, the fixing mechanism 10 is provided with a sliding rail, and the connecting member 21 is provided with a slider that is slidably connected to the sliding rail. The sliding fit between the slider and the sliding rail is used to realize sliding of the connecting member 21 relative to the fixing mechanism 10, and the sliding direction and sliding distance are not limited.

The test member 22 is configured to abut against the electrode terminal 401 of the battery cell 400 to realize acquisition of electrical signals. The test member 22 shall be electrically connected to an external electrical test apparatus to transmit acquired electrical signals to the external electrical test apparatus. Specifically, during test, the two test members 22 abut against the positive pole and negative pole of the battery cell 400 respectively.

In some embodiments, at least one of the test members 22 is slidably connected to the connecting member 21 in a third direction Y, the third direction Y being perpendicular to the first direction X.

It can be understood that the third direction Y is the direction along which the electrode terminals 401 of the battery cell 400 are apart from each other, and since distance between the electrode terminals 401 varies for battery cells 400 of different dimensions, one of the test members 22 may be selected to slide along the third direction Y relative to the connecting member 21, or the two test members 22 both slide along the third direction Y relative to the connecting member 21, so as to adapt to battery cells 400 with different distances between the electrode terminals 401.

Herein, the sliding of the test member 22 along the third direction Y relative to the connecting member 21 refers to relative sliding along the forward direction or backward direction of the third direction Y.

In addition, the sliding form between the test member 22 and the connecting member 21 may be direct sliding, indirect sliding, partially direct sliding, or partially indirect sliding.

For example, the connecting member 21 is provided with a sliding rail, and the test member 22 is provided with a slider that is slidably connected to the sliding rail. The sliding fit between the slider and the sliding rail is used to realize sliding of the test relative to the connecting member 21, and the sliding direction and sliding distance are not limited.

With such arrangement, the test members 22 can be used to obtain freedom of movement along the third direction Y, so as to further adapt to test requirements of battery cells 400 of different dimensions.

Referring to FIG. 6, in some embodiments, the connecting member 21 includes a vertical portion 211 slidably connected to the fixing mechanism 10 and a horizontal portion 212 perpendicularly connected to the vertical portion 211, and the test members 22 are fitted on the horizontal portion 212 and slide relative to the horizontal portion 212.

Herein, the connecting member 21 is formed to be similar to a T-shaped structure, and the vertical portion 211 is slidably connected to the fixing mechanism 10, to be specific, the sliding form between the vertical portion 211 and the fixing mechanism 10 may be direct sliding, indirect sliding, partially direct sliding, or partially indirect sliding. The vertical portion 211 is a structural member arranged in the second direction Z, and the horizontal portion 212 is arranged in a direction parallel to the third direction Y In this way, the test member 22 is slidably connected to the horizontal portion 212 and moves relative to the connecting member 21.

Referring to FIG. 6, in some embodiments, the test member 22 includes a test body 221 and a probe 222 provided on the test body 221, where the test body 221 is slidably connected to the connecting member 21, one end of the probe 222 abuts against an electrode terminal 401 of the battery cell 400, and the other end of the probe 222 is electrically connected to an external test device.

It can be understood that the test body 221 plays the role of carrying the probe 222, and the probe 222 moves along with the test body 221 to adapt to test requirements of battery cells 400 with different pole-to-pole distances.

Herein, the shape structure of the test body 221 includes but is not limited to a straight strip structure or an L-shaped structure.

Referring to FIG. 6, in some embodiments, at least two probes 222 are provided, and the probes 222 are spaced apart along the first direction X.

It can be understood that increasing the probe 222 count can adapt to different width requirements of the electrode terminal 401 in the first direction X, thereby improving the acquisition accuracy of the test member 22 for the electrode terminal 401 of the corresponding battery cell 400.

Optionally, two probes 222 are provided, the two probes 222 are apart from each other along the first direction X, and the distance between the two probes 222 is less than the width of the electrode terminal 401 of the battery cell 400 in the first direction X. In this way, when coming into abutting contact with the electrode terminal 401 of the battery cell 400, the two probes 222 can both accomplish the abutting action.

Referring to FIG. 6, in some embodiments, the test probe mechanism 20 further includes locking members 23 for locking the test members 22, where the locking member 23 is inserted through the test member 22 and capable of abutting against the connecting member 21.

It can be understood that the locking member 23 is configured to lock the test member 22, reducing the probability of the test member 22 sliding relative to the connecting member 21. Specifically, the locking member 23 is inserted through the test member 22 and remains relatively stationary with the connecting member 21 by means of abutting.

For example, as shown in FIG. 6, the locking member 23 includes a locking bolt 231, and the test member 22 is provided with a threaded hole. The locking bolt 231 is screwed into the threaded hole until abutting against the connecting member 21 to prevent the test member 22 from sliding relative to the connecting member 21.

For example, as shown in FIG. 6, the locking member 23 includes a stud 232, and similarly, the test member 22 is provided with a threaded hole. The stud 232 is screwed into the threaded hole until abutting against the connecting member 21 to prevent the test member 22 from sliding relative to the connecting member 21. Unlike the locking bolt 231, the stud 232 can be completely screwed into the test member 22, that is, hidden within the test member 22 in appearance.

Referring to FIG. 1 to FIG. 6 and FIG. 8, the following is a specific embodiment of this application.

Atest apparatus 100 includes a fixing mechanism 10, a plurality of test probe mechanism 20, a support frame 50, a driving mechanism 60, a sliding mechanism 30, and a synchronization mechanism 40.

The test probe mechanisms 20 are slidably connected to the fixing mechanism 10 side by side along a first direction X. The first direction X is the arrangement direction of the test probe mechanisms 20, and the first direction X is also related to the arrangement of the incoming battery cells 400. For example, when electrode terminals 401 of the incoming battery cell 400 are provided on an end surface where thickness and length of the battery cell 400 are located, the first direction X may be the thickness direction or length direction of the incoming battery cell 400; when the electrode terminals 401 of the incoming battery cell 400 are provided on an end surface where width and length of the battery cell 400 are located, the first direction X may be the width direction or length direction of the incoming battery cell 400; or when the electrode terminals 401 of the incoming battery cell 400 are provided on an end surface where thickness and width of the battery cell 400 are located, the first direction X may be the thickness direction or width direction of the incoming battery cell 400. In this way, the test probe mechanisms 20 can slide along the first direction X to adapt to a single variable in the length, width, or thickness of the incoming battery cells 400.

The fixing mechanism 10 is provided with a plurality of test probe mechanisms 20, and the test probe mechanisms 20 can slide along the first direction X relative to the fixing mechanism 10. In this way, distances between the test probe mechanisms 20 can be adaptively adjusted according to the dimensions of to-be-tested battery cells 400, that is, the distances can quickly respond and adapt to changes in dimensions of incoming battery cells 400, so that the test efficiency can be significantly improved.

The sliding mechanism 30 includes a guide rail provided on the fixing mechanism 10 and sliders provided on corresponding test probe mechanisms 20, the sliders being slidably connected to the guide rail.

With such arrangement, the sliders in the sliding mechanism 30 are used to slide adaptively on the guide rail to satisfy that the test probe mechanisms 20 slide along the first direction X relative to the fixing mechanism 10.

The synchronization mechanism 40 includes a synchronization member 41 that is connected to the test probe mechanisms 20 and a driving member 42 that drives the synchronization member 41 to move relative to the fixing mechanism 10, and the synchronization member 41 drives, during movement relative to the fixing mechanism 10, the test probe mechanisms 20 to slide synchronously.

The synchronization mechanism 40 is configured to realize the synchronous sliding of the test probe mechanisms 20 along the first direction X. Herein, the synchronization mechanism 40 capable of realizing the synchronous sliding of the test probe mechanisms 20 shall include the synchronization member 41 and the driving member 42. The synchronization member 41 is configured to be connected to the test probe mechanisms 20 and play the role of synchronous driving, and the driving member 42 serves as a power source to drive the synchronization member 41 to move relative to the fixing mechanism 10, where the moving synchronization member 41 drives the test probe mechanisms 20 to slide synchronously.

Specifically, the synchronization member 41 is slidably connected to the fixing mechanism 10 in a second direction Z, the synchronization member 41 is provided with a plurality of guide slots 411 corresponding to the test probe mechanisms 20, and the test probe mechanism 20 is provided with a limiting member 412 slidably connected to the guide slot 411, the second direction Z being perpendicular to the first direction X.

Based on the arrangement of the electrode terminals 401 of the incoming battery cell 400, when the electrode terminals 401 are provided on an end surface where thickness and length of the battery cell 400 are located, the first direction X may be the thickness direction or length direction of the incoming battery cell 400, and the second direction Z is the width direction of the battery cell 400; when the electrode terminals 401 are provided on an end surface where width and length of the battery cell 400 are located, the first direction X may be the width direction or length direction of the incoming battery cell 400, and the second direction Z is the thickness direction of the battery cell 400; or when electrode terminals 401 are provided on an end surface where thickness and width of the battery cell 400 are located, the first direction X may be the thickness direction or width direction of the incoming battery cell 400, and the second direction Z is the length direction of the battery cell 400.

The sliding form between the synchronization member 41 and the fixing mechanism 10 may be direct sliding or indirect sliding, for example, the relative sliding of the two is realized via a guide rail mechanism. In addition, the driving member 42 drives the synchronization member 41 to reciprocate along the second direction Z relative to the fixing mechanism 10. Similarly, whether sliding forward or backward along the second direction Z, the synchronization member 41 slides along the second direction Z.

The guide slots 411 shall be in a plane where the first direction X and the second direction Z are located, and the guide slots 411 include but are not limited to inclined straight slots, arc-shaped slots, or a combination of inclined straight slots and arc-shaped slots. An extension direction of the guide slot 411 is at an angle with the second direction Z. Herein, the extension direction of the guide slot is a direction of a line connecting two ends of the guide slot. The guide slots 411 may be arranged in a same direction on the synchronization member 41, to be specific, the included angles between the extension directions of the guide slots 411 and the second direction Z are all acute angles or obtuse angles. In this case, driven by the synchronization member 41, the corresponding test probe mechanisms 20 slide synchronously along the forward direction or backward direction of the first direction X. Alternatively, the guide slots 411 may be arranged in opposite directions on the synchronization member 41, to be specific, the included angles between the extension directions of part of the guide slots 411 and the second direction Z are acute angles, and the included angles between the extension directions of the other part of the guide slots 411 and the second direction Z are obtuse angles. In this case, driven by the synchronization member 41, test probe mechanisms 20 corresponding to the guide slots 411 that have acute included angles of their extension directions with the second direction Z slide synchronously along the forward direction of the first direction X, and test probe mechanisms 20 corresponding to the guide slots 411 that have obtuse included angles of their extension directions with the second direction Z slide synchronously along the backward direction of the first direction X. Certainly, the correspondences can be exchanged.

The limiting member 412 is limited to slide in the guide slot 411, and according to the slot shape of the guide slot 411, the limiting member 412 includes but is not limited to a limiting column, a limiting block, or a limiting pipe.

Optionally, the guide slots 411 are disposed in mirror symmetry with respect to the central axis of a screw rod portion 423.

The screw rod portion 423 of the driving portion is located at the center of symmetry of the synchronization member 41, and when the screw rod portion 423 rotates around its axis, the synchronization member 41 reciprocates along the second direction Z under the driving of a nut portion 424. Since the guide slots 411 are disposed in mirror symmetry with respect to the central axis of the screw rod portion 423, the movement trajectories of the limiting members 412 on the test probe mechanisms 20 in the corresponding guide slots 411 are also symmetrical. In this way, the interaction forces between the guide slots 411 and the corresponding limiting members 412 apply a more uniform force to the synchronization member 41, such that the synchronization member 41 moves more smoothly relative to the fixing mechanism 10.

The guide slot 411 is an inclined straight slot, and every two guide slots 411 form a group and are symmetrically distributed on the synchronization member 41 with respect to the central axis of the screw rod portion 423. In addition, a guide slot 411 farther away from the central axis of the screw rod portion 423 has larger included angle with the second direction Z. This helps the test probe mechanisms 20 disperse along the first direction X under the driving of the limiting member and be spaced apart from each other.

The guide slot 411 is provided with a first slot end 411_a_ and a second slot end 411_b_, and the limiting member 412 slides reciprocally between the first slot end 411_a_ and the second slot end 411_b_.

Herein, the slot end of the guide slot 411 refers to a start position or end position of the guide slot 411, the two slot ends are identical and communicate with each other, and the limiting member 412 slides in the guide slot 411. The first slot end is the start position of the guide slot 411, and the second slot end 411_b_ is the end position of the guide slot 411. The limiting member 412 on each test probe mechanism 20 slides reciprocally between the first slot end 411_a_ and the second slot end 411_b_ of the corresponding guide slot 411. It can be understood that when the limiting member 412 is located at the first slot end 411_a_, the test probe mechanism 20 is at a first position on the fixing mechanism 10, and when the limiting member 412 is located at the second slot end 411_b_, the test probe mechanism 20 is at a second position on the fixing mechanism 10. Herein, the test probe mechanism 20 may be at the first position, the second position, or an intermediate position between the first position and the second position for the OCV test on the incoming battery cell 400.

The driving member 42 includes a first fixed portion 421, a second fixed portion 422, the screw rod portion 423 with two ends connected to the first fixed portion 421 and the second fixed portion 422 respectively, and the nut portion 424 threadedly connected to the screw rod portion 423, where the first fixed portion 421 and the second fixed portion 422 are spaced apart from each other along the second direction Z on the fixing mechanism 10, and the nut portion 424 is fixedly connected to the synchronization member 41.

The first fixed portion 421 and the second fixed portion 422 are components that have fixed relative positions in the driving member 42, the first fixed portion 421 and the second fixed portion 422 may be block structures or strip structures, and the two are configured to be fixed to the fixing mechanism 10, for example, the first fixed portion 421 and the second fixed portion 422 may be connected to the fixing mechanism via fasteners such as screws and pins.

The screw rod portion 423 is provided with an external thread and is threadedly engaged with the nut portion 424. The screw rod portion 423 rotates along the direction of its own axis and is engaged with the nut portion 424 during rotation for connecting the nut portion 424 and the synchronization member 41, allowing the synchronization member 41 to reciprocate along the second direction Z under the driving of the nut portion 424.

The nut portion 424 is a structural member with an internal thread and is threadedly engaged with the screw rod portion 423. The nut portion 424 may be a non-standard nut or a block with an internal thread. While satisfying engagement with the screw rod portion 423, the nut portion 424 also needs to be connected to the synchronization member 41.

Herein, the screw rod portion 423 may rotate around its own axial direction manually or rotate automatically around its axis by means of mechanical transmission. For example, when the screw rod portion 423 rotates clockwise around its axis, the nut portion 424 drives the synchronization member 41 to move along the forward direction of the second direction Z; and when the screw rod portion 423 rotates counterclockwise around its axis, the nut portion 424 drives the synchronization member 41 to move along the backward direction of the second direction Z.

With such arrangement, the screw rod portion 423 rotates around its axis relative to the first fixed portion 421 and the second fixed portion 422, and the nut portion 424 is threadedly engaged with the screw rod portion 423. Since the nut portion 424 is connected to the synchronization member 41, when reciprocating along the axial direction of the screw rod portion 423, the nut portion 424 also drives the synchronization member 41 to reciprocate along the second direction Z.

The fixing mechanism 10 is slidably connected to the support frame 50 and capable of sliding along the second direction Z relative to the support frame 50.

Herein, the support frame 50 plays the role of carrying to satisfy freedom of movement of the test probe mechanisms 20 along the second direction Z. The sliding form between the support frame 50 and the fixing mechanism 10 may be direct sliding, indirect sliding, partially direct sliding, or partially indirect sliding.

A fixed end of the driving mechanism 60 is connected to the support frame 50, an output end of the driving mechanism 60 is connected to the fixing mechanism 10, and the driving mechanism 60 drives the fixing mechanism 10 to reciprocate along the second direction Z relative to the support frame 50.

It can be understood that the driving mechanism 60 is configured to serve as a power source to drive the fixing mechanism 10 to move along the second direction Z relative to the support frame 50, featuring easier moving process.

Herein, the driving mechanism 60 includes but is not limited to a screw rod mechanism, a cylinder mechanism, a lifting mechanism, or a servo motor.

The test probe mechanism 20 includes a connecting member 21 slidably connected to the fixing mechanism 10 and two test members 22 connected to an end of the connecting member 21 away from the fixing mechanism 10. At least one of the test members 22 is slidably connected to the connecting member 21 in a third direction Y, the third direction Y being perpendicular to the first direction X.

It can be understood that the third direction Y is the direction along which the electrode terminals 401 of the battery cell 400 are apart from each other, and since distance between the electrode terminals 401 varies for battery cells 400 of different dimensions, one of the test members 22 may be selected to slide along the third direction Y relative to the connecting member 21, or the two test members 22 both slide along the third direction Y relative to the connecting member 21, so as to adapt to battery cells 400 with different distances between the electrode terminals 401.

The connecting member 21 includes a vertical portion 211 slidably connected to the fixing mechanism 10 and a horizontal portion 212 perpendicularly connected to the vertical portion 211, and the test members 22 are fitted on the horizontal portion 212 and slide relative to the horizontal portion 212.

The test member 22 includes a test body 221 and a probe 222 provided on the test body 221, where the test body 221 is slidably connected to the connecting member 21, one end of the probe 222 abuts against an electrode terminal 401 of the battery cell 400, and the other end of the probe 222 is electrically connected to an external test device.

Optionally, two probes 222 are provided, the two probes 222 are apart from each other along the first direction X, and the distance between the two probes 222 is less than the width of the electrode terminal 401 of the battery cell 400 in the first direction X. In this way, when coming into abutting contact with the electrode terminal 401 of the battery cell 400, the two probes 222 can both accomplish the abutting action.

The test probe mechanism 20 further includes locking members 23 for locking the test members 22, where the locking member 23 is inserted through the test member 22 and capable of abutting against the connecting member 21.

It can be understood that the locking member 23 is configured to lock the test member 22, making the test member 22 slide relative to the connecting member 21. Specifically, the locking member 23 is inserted through the test member 22 and remains relatively stationary with the connecting member 21 by means of abutting.

For example, as shown in FIG. 6, the locking member 23 includes a locking bolt 231, and the test member 22 is provided with a threaded hole. The locking bolt 231 is screwed into the threaded hole until abutting against the connecting member 21 to prevent the test member 22 from sliding relative to the connecting member 21.

For example, as shown in FIG. 6, the locking member 23 includes a stud 232, and similarly, the test member 22 is provided with a threaded hole. The stud 232 is screwed into the threaded hole until abutting against the connecting member 21 to prevent the test member 22 from sliding relative to the connecting member 21. Unlike the locking bolt 231, the stud 232 can be completely screwed into the test member 22, that is, hidden within the test member 22 in appearance.

Figure 7:
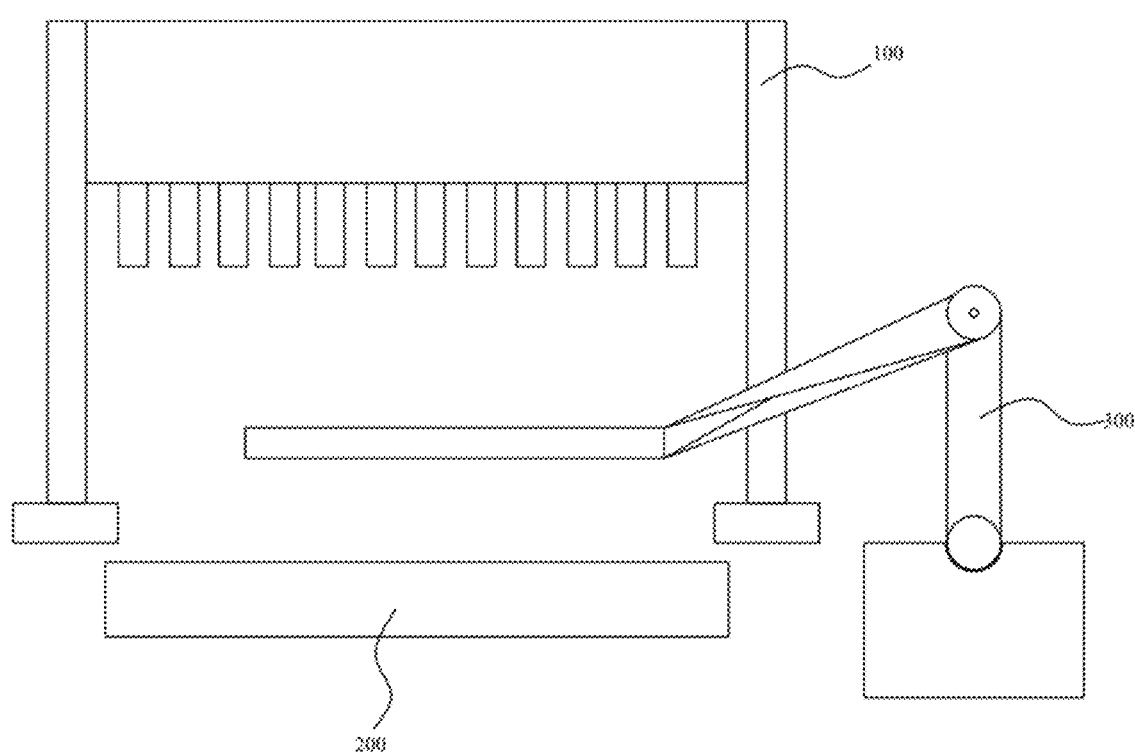
FIG. 7 is a schematic structural diagram of a battery production line according to some embodiments of this application.

Referring to FIG. 7 and FIG. 8, an embodiment of this application further provides a battery production line 1000 including the foregoing test apparatus 100.

For the battery production line 1000 provided in this embodiment of this application, on the basis of having the foregoing test apparatus 100, the battery production line 1000 has higher production efficiency.

It can be understood that the battery production line 1000 further includes a delivery mechanism 200, where the delivery mechanism 200 is configured to deliver to-be-tested battery cells 400 to a test position. In addition, the battery production line 1000 further includes a transfer mechanism 300, where the transfer mechanism 300 is configured to remove battery cells 400 of the same batch from the delivery mechanism and transfer them to the test apparatus 100.

The foregoing descriptions are merely preferred embodiments of this application which are not intended to limit this application. Any modifications, equivalent replacements, and improvements made without departing from the spirit and principle of this application shall fall within the protection scope of this application.

The invention claimed is:

1. A test apparatus for testing incoming battery cells, characterized by comprising:

a fixing structure; and a plurality of test probe structures, wherein the test probe structures are slidably connected to the fixing structure side by side along a first direction, wherein the test apparatus further comprises a synchronizer, wherein the synchronizer comprises a synchronization structure that is connected to the test probe structures and a driver that drives the synchronization structure to move relative to the fixing structure, and the synchronization structure drives, during movement relative to the fixing structure, the test probe structures to slide synchronously, wherein the synchronization structure is slidably connected to the fixing structure in a second direction, the synchronization structure comprises a plate structure comprising a plurality of guide slots extending in a plane where the first direction and the second direction are located corresponding to the probe structures and each of the test probe structures is provided with a limiting structure slidably connected to the guide slot, the second direction being perpendicular to the first direction, and wherein the driver comprises a first fixed portion, a second fixed portion, a screw rod portion with two ends connected to the first fixed portion and the second fixed portion respectively, and a nut portion threadedly connected to the screw rod portion, wherein the first fixed portion and the second fixed portion are spaced apart from each other along the second direction on the fixing structure, and the nut portion is fixedly connected to the synchronization structure.

2. The test apparatus according to claim 1, wherein each of the test probe structures is capable of independently sliding along the first direction relative to the fixing structure.

3. The test apparatus according to claim 1, wherein at least some of the test probe structures slide synchronously along the first direction relative to the fixing structure.

4. The test apparatus according to claim 3, wherein the test probe structures slide synchronously along the first direction relative to the fixing structure and are arranged equidistantly.

5. The test apparatus according to claim 1, wherein the test apparatus comprises a sliding structure, wherein the sliding structure comprises a guide rail provided on the fixing structure and sliders provided on corresponding test probe structures, the sliders being slidably connected to the guide rail.

6. The test apparatus according to claim 1, wherein the guide slot is provided with a first slot end and a second slot end, and the limiting structure slides reciprocally between the first slot end and the second slot end.

7. The test apparatus according to claim 6, wherein distances between first slot ends of any adjacent two of the guide slots are equal; and/or distances between second slot ends of any adjacent two of the guide slots are equal.

8. The test apparatus according to claim 1, wherein the guide slots are disposed in mirror symmetry with respect to the central axis of the screw rod portion.

9. The test apparatus according to claim 8, wherein the test apparatus further comprises a driving structure, wherein a fixed end of the driving structure is connected to the support frame, an output end of the driving structure mechanism is connected to the fixing structure, and the driving structure drives the fixing structure to reciprocate along the second direction relative to the support frame.

10. The test apparatus according to claim 1, wherein the test apparatus further comprises a support frame, wherein the fixing structure is slidably connected to the support frame and capable of sliding along a second direction relative to the support frame.

11. The test apparatus according to claim 1, wherein each of the test probe structures comprises a connector slidably connected to the fixing structure and two test structures connected to an end of the connector away from the fixing structure.

12. The test apparatus according to claim 11, wherein at least one of the test structures is slidably connected to the connector in a third direction, the third direction being perpendicular to the first direction.

13. The test apparatus according to claim 11 wherein the connector comprises a vertical portion slidably connected to the fixing structure and a horizontal portion perpendicularly connected to the vertical portion, and the test structures are fitted on the horizontal portion and slide relative to the horizontal portion.

14. The test apparatus according to claim 11, wherein each of the two test structures comprises a test body and a probe provided on the test body, wherein the test body is slidably connected to the connector, one end of the probe abuts against an electrode terminal of the battery cell, and the other end of the probe is electrically connected to an external test device.

15. The test apparatus according to claim 14, wherein at least two probes are provided, and the probes are spaced apart along the first direction.

16. The test apparatus according to claim 11 wherein the test probe structure further comprises lockers for locking the test structures, wherein the locker is inserted through the test structure member and capable of abutting against the connector connecting member.

17. A battery production line, characterized by comprising the test apparatus according to claim 1.

* * * * *